United States Patent
Marov et al.

(10) Patent No.: US 9,647,690 B2
(45) Date of Patent: May 9, 2017

(54) SYSTEMS AND METHODS FOR ERROR CORRECTION CODING

(71) Applicant: Raidix Corporation, St. Petersburg (RU)

(72) Inventors: Aleksei Marov, St. Petersburg (RU); Aleksei Uteshev, St. Petersburg (RU)

(73) Assignee: Raidix Corporation, St. Petersburg (RU)

( * ) Notice: Subject to any disclaimer, the term of this patent is extended or adjusted under 35 U.S.C. 154(b) by 6 days.

(21) Appl. No.: 14/806,874

(22) Filed: Jul. 23, 2015

(65) Prior Publication Data

US 2016/0026527 A1    Jan. 28, 2016

Related U.S. Application Data

(60) Provisional application No. 62/028,056, filed on Jul. 23, 2014.

(51) Int. Cl.
| | |
|---|---|
| *H03M 13/15* | (2006.01) |
| *G06F 11/10* | (2006.01) |
| *H03M 13/00* | (2006.01) |

(52) U.S. Cl.
CPC ....... *H03M 13/154* (2013.01); *G06F 11/1076* (2013.01); *H03M 13/15* (2013.01); *H03M 13/151* (2013.01); *H03M 13/1525* (2013.01); *H03M 13/1575* (2013.01); *H03M 13/617* (2013.01)

(58) Field of Classification Search
CPC ............... H03M 13/154; H03M 13/1525
See application file for complete search history.

(56) References Cited

U.S. PATENT DOCUMENTS

| | | | | | |
|---|---|---|---|---|---|
| 4,868,828 | A | * | 9/1989 | Shao ............... | H03M 13/151 714/704 |
| 5,694,330 | A | * | 12/1997 | Iwamura .......... | H03M 13/151 702/85 |
| 5,712,861 | A | * | 1/1998 | Inoue .............. | H03M 13/151 714/752 |
| 5,742,620 | A | * | 4/1998 | Iwamura .......... | H03M 13/151 714/780 |
| 5,771,244 | A | * | 6/1998 | Reed ............... | H03M 13/151 714/752 |
| 5,942,005 | A | * | 8/1999 | Hassner .......... | G11B 20/1833 714/784 |
| 6,449,746 | B1 | * | 9/2002 | Truong ........... | H03M 13/1515 714/784 |
| 6,704,902 | B1 | * | 3/2004 | Shinbashi ........ | H03M 13/1515 714/704 |

(Continued)

*Primary Examiner* — Joseph D Torres
(74) *Attorney, Agent, or Firm* — Proskauer Rose LLP (57) ABSTRACT

Described are methods, systems, and apparatus, including computer program products for error correction coding and decoding procedures for data storage or transfer. A plurality of data blocks is received. A plurality of checksum blocks are generated by multiplying the plurality of data blocks by a coding matrix, where the coding matrix comprises values of at least one basic interpolation polynomial and the multiplying is according to a finite field arithmetic for a finite field comprising all possible values of the plurality of data blocks and the plurality of coding blocks. The plurality of data blocks and the plurality of checksum blocks are stored in a data storage medium.

10 Claims, 4 Drawing Sheets

(56) References Cited

U.S. PATENT DOCUMENTS

| | | | |
|---|---|---|---|
| 2002/0099996 A1* | 7/2002 | Demura | G06F 11/1008 714/769 |
| 2010/0031127 A1* | 2/2010 | Panteleev | H03M 13/1515 714/784 |
| 2016/0026527 A1* | 1/2016 | Marov | G06F 11/1076 714/764 |

* cited by examiner

SYSTEMS AND METHODS FOR ERROR CORRECTION CODING

REFERENCE TO RELATED APPLICATION

This application claims the benefit of priority of U.S. Patent Application No. 62/028,056 filed Jul. 23, 2014, entitled "Systems and Methods for Error Correcting Coding," the entirety of which is incorporated herein by reference.

FIELD OF THE TECHNOLOGY

The present technology relates generally to error correction coding, and more specifically, to error correction coding and decoding for data storage or transfer.

BACKGROUND

Data can be corrupted when stored to and/or read from a storage device, or transmitted over an unreliable channel. For example, data can become corrupted when it is stored to a magnetic hard drive. Without a mechanism to detect when data has been corrupted and/or correct the corruption, the data can be unusable. Error correction coding, in some applications, can be used to facilitate reliable storage and retrieval of data, and/or delivery of data. In general, the concept behind error correction coding is that by adding redundancy to the data, the redundancy can permit correcting corruption in the data. Some approaches to error correction coding can be referred to as systematic. A systematic error correction coding approach generally involves providing the data and some amount of check bits, parity bits, error correction codes, or other data generated based on the data to facilitate recovery from corruption.

SUMMARY OF THE TECHNOLOGY

Accordingly, there is a need for efficient approaches to systematically encoding data to facilitate error recovery, and for efficiently decoding and recovering data. The present technology relates to techniques for systematically encoding data that, in some embodiments, can provide computational efficiency gains over existing techniques. For example, the matrix-based techniques of some embodiments of the present technology can facilitate recovery of failure errors and silent data corruption errors without requiring computationally-expensive approaches using polynomials over a finite field.

In one aspect, there is a computer-implemented method for systematically coding a plurality of data blocks for error detection and correction. The method includes receiving, by a computer system, the plurality of data blocks. The method includes generating, by the computer system, a plurality of checksum blocks by multiplying the plurality of data blocks by a coding matrix, wherein the coding matrix includes values of at least one basic interpolation polynomial, the multiplying according to a finite field arithmetic for a finite field including all possible values of the plurality of data blocks and the plurality of coding blocks. The method includes storing, by the computer system, the plurality of data blocks and the plurality of checksum blocks in a data storage medium.

In some embodiments, the coding matrix consists of a plurality of values of a plurality of basic interpolation polynomials computed for a sequence of powers of a primitive element of the finite field. In some embodiments, the method includes constructing the coding matrix of the form:

$$\begin{pmatrix} \tilde{W}_1(a^{N-1}) & \tilde{W}_1(a^{N-2}) & \ldots & \tilde{W}_1(a^m) \\ \tilde{W}_2(a^{N-1}) & \tilde{W}_2(a^{N-2}) & \ldots & \tilde{W}_2(a^m) \\ \vdots & \vdots & \vdots & \vdots \\ \tilde{W}_m(a^{N-1}) & \tilde{W}_m(a^{N-2}) & \ldots & \tilde{W}_m(a^m) \end{pmatrix}$$

where the plurality of data blocks consists of n data blocks and the plurality of checksum blocks consists of m checksum blocks; where N=m+n; where a is a primitive element of the finite field; and where $\tilde{W}_1(x), \ldots, \tilde{W}_m(x)$ are basic interpolation polynomials.

In some embodiments, the method includes generating, by the computer system, the coding matrix in response to receiving the plurality of data blocks. In some embodiments, the method includes receiving, by the computer system, a second plurality of data blocks. In some embodiments, the method includes generating, by the computer system, a second coding matrix in response to receiving the plurality of data blocks. In some embodiments, the method includes generating, by the computer system, a second plurality of checksum blocks by multiplying the second plurality of data blocks by the second coding matrix. In some embodiments, the method includes storing, by the computer system, the second plurality of data blocks and the second plurality of checksum blocks in the data storage medium.

In some embodiments, the method includes receiving, by the computer system, a second plurality of data blocks. In some embodiments, the method includes generating, by the computer system, a second plurality of checksum blocks by multiplying the second plurality of data blocks by the coding matrix. In some embodiments, the method includes storing, by the computer system, the second plurality of data blocks and the second plurality of checksum blocks in the data storage medium.

In another aspect, there is a computer-implemented method for decoding a plurality of code blocks for error detection and correction. The method includes receiving, by a computer system, the plurality of code blocks, the plurality of code blocks including a plurality of data blocks and a plurality of checksum blocks. The method includes detecting, by the computer system, a failure error at a failure location within the plurality of code blocks. The method includes detecting, by the computer system, a silent data corruption (SDC) error at an SDC location within the plurality of blocks, detecting the SDC error including: calculating a syndrome matrix from a first portion of the plurality of code blocks not containing the failure error; and determining the SDC location of the SDC error in the plurality of blocks based on the syndrome matrix. The method includes constructing, by the computer system, a recovery matrix using the failure location and the SDC location. The method includes recovering, by the computer system, a first block containing the failure error and a second block containing the SDC error by multiplying the recovery matrix with a second portion of the plurality of code blocks not containing the failure error and the SDC error, wherein the recovery matrix includes values of at least one basic interpolation polynomial, the multiplying according to a finite field arithmetic for a finite field including all possible values of the plurality of data blocks and the plurality of coding blocks.

In some embodiments, determining the SDC location of the SDC error in the plurality of blocks based on the syndrome matrix includes constructing an error locator polynomial based on the syndrome matrix. In some embodiments, the error locator polynomial includes a plurality of coefficients, the method further including determining the coefficients of the error locator polynomial using a Berlekamp-Massey algorithm. In some embodiments, determining the SDC location of the SDC error in the plurality of blocks based on the syndrome matrix includes determining the SDC location based on a root of the error locator polynomial. In some embodiments, the recovery matrix consists of a plurality of values of a plurality of interpolation polynomials.

In some embodiments, constructing the recovery matrix using the failure location and the SDC location the recovery matrix further includes constructing the recovery matrix of the form:

$$R_{l,N-l} = [\tilde{W}_j(a^{N-1-i})], j=\{1, \ldots, l\},$$
$$i=\{0, \ldots, N-1\} \backslash \{k_1, \ldots k_l\}$$

where the plurality of data blocks consists of n data blocks and the plurality of checksum blocks consists of m checksum blocks; where N=m+n; where a is a primitive element of the finite field; where $\tilde{W}_1(x), \ldots, \tilde{W}_l(x)$ are basic interpolation polynomials; where l is a number of failure errors and SDC errors; and where $\{k_1, \ldots, k_l\}$ include the failure location and the SDC location.

In another aspect, there is a data storage system. The data storage system includes one or more storage devices. The data storage system includes a code block generation module, wherein the code block generation module is configured, in response to receiving a first plurality of data blocks, to generate a first plurality of checksum blocks by multiplying the first plurality of data blocks by a coding matrix, wherein the coding matrix includes values of at least one basic interpolation polynomial, the multiplying according to a finite field arithmetic for a finite field including all possible values of the first plurality of data blocks and the first plurality of coding block; and store the first plurality of data blocks and the first plurality of checksum blocks in one or more storage devices of the one or more storage devices. The data storage system includes an error recovery module, wherein the error recovery module is configured to receive a plurality of code blocks, the plurality of code blocks including a second plurality of data blocks and a second plurality of checksum blocks, from the one or more storage devices; and detect a failure error at a failure location within the plurality of code blocks. The error recovery module is configured to detect an SDC error at an SDC location within the plurality of code blocks by calculating a syndrome matrix from a first portion of the plurality of code blocks not containing the failure error; and determining the SDC location of the SDC error in the plurality of code blocks based on the syndrome matrix. The error recovery module is configured to construct a recovery matrix using the failure location and the SDC location; and recover a first block containing the failure error and a second block containing the SDC error by multiplying the recovery matrix with a second portion of the plurality of code blocks not containing the failure error and the SDC error, wherein the recovery matrix includes values of at least one basic interpolation polynomial, the multiplying according to the finite field arithmetic for the finite field.

In some embodiments, the coding matrix consists of a plurality of values of a plurality of basic interpolation polynomials computed for a sequence of powers of a primitive element of the finite field. In some embodiments, the code block generation module is further configured to construct the coding matrix of the form:

$$\begin{pmatrix} \tilde{W}_1(a^{N-1}) & \tilde{W}_1(a^{N-2}) & \ldots & \tilde{W}_1(a^m) \\ \tilde{W}_2(a^{N-1}) & \tilde{W}_2(a^{N-2}) & \ldots & \tilde{W}_2(a^m) \\ \vdots & \vdots & \vdots & \vdots \\ \tilde{W}_m(a^{N-1}) & \tilde{W}_m(a^{N-2}) & \ldots & \tilde{W}_m(a^m) \end{pmatrix}$$

where the first plurality of data blocks consists of n data blocks and the first plurality of checksum blocks consists of m checksum blocks; where N=m+n; where a is a primitive element of the finite field; and where $\tilde{W}_1(x), \ldots, \tilde{W}_m(x)$ are basic interpolation polynomials.

In some embodiments, the code block generation module is further configured to generate the coding matrix in response to receiving the first plurality of data blocks; receive a third plurality of data blocks; generate a second coding matrix in response to receiving the third plurality of data blocks; generate a third plurality of checksum blocks by multiplying the third plurality of data blocks by the second coding matrix; and store the third plurality of data blocks and the third plurality of checksum blocks in a second one or more storage devices of the one or more storage devices.

In some embodiments, the code block generation module is further configured to receive a third plurality of data blocks; generate a third plurality of checksum blocks by multiplying the third plurality of data blocks by the coding matrix; and store the third plurality of data blocks and the third plurality of checksum blocks in a second one or more storage devices of the one or more storage devices.

In some embodiments, the error recovery module is configured to determine the SDC location of the SDC error in the plurality of code blocks based on the syndrome matrix by constructing an error locator polynomial based on the syndrome matrix. In some embodiments, the error locator polynomial includes a plurality of coefficients, wherein the error recovery module is configured to determine the coefficients of the error locator polynomial using a Berlekamp-Massey algorithm. In some embodiments, the error recovery module is configured to determine the SDC location of the SDC error in the plurality of code blocks based on the syndrome matrix by determining the SDC location based on a root of the error locator polynomial. In some embodiments, the recovery matrix consists of a plurality of values of a plurality of interpolation polynomials.

In some embodiments, the error recovery module is configured to construct the recovery matrix using the failure location and the SDC location by constructing the recovery matrix of the form:

$$R_{l,N-l} = [\tilde{W}_j(a^{N-1-i})], j=\{1, \ldots, l\},$$
$$i=\{0, \ldots, N-1\} \dagger \{k_1, \ldots k_l\}$$

where the second plurality of data blocks consists of n data blocks and the second plurality of checksum blocks consists of m checksum blocks; where N=m+n; where a is a primitive element of the finite field; where $\tilde{W}_1(x), \ldots, \tilde{W}_l(x)$ are basic interpolation polynomials; where l is a number of failure errors and SDC errors; and where $\{k_1, \ldots, k_l\}$ include the failure location and the SDC location.

BRIEF DESCRIPTION OF THE DRAWINGS

The foregoing and other objects, features, and advantages of the present technology, as well as the technology itself, will be more fully understood from the following description of various embodiments, when read together with the accompanying drawings, in which.

DETAILED DESCRIPTION

Systems and methods of the present technology can provide fault tolerant protection of information. Embodiments of the technology can be implemented in data storage (e.g., data storage in hard disk drives, solid state drives, etc.) or data transfer devices (e.g., network cards, modems, etc.). For illustrative purposes, systems and methods of the present technology are described in the context of data storage in hard disk drives. However, the present technology can also be used in other applications involving the storage and transfer of digital information.

There are generally two types of data corruption. The first type, a failure error, relates to failure of a storage device (e.g., a drive or a part of the drive), the position of which can be detected by technical (e.g., hardware) control devices. Storage devices can include hardware and/or firmware for detecting the location of failure errors, such as, e.g., failed sectors. For example, storage devices can include S.M.A.R.T (Self-Monitoring, Analysis and Reporting Technology), which can monitor the state of storage devices. In some storage devices, some controllers or cards can check failure of storage devices or their parts. Such a failure can be referred to as a failure error, or the refusal or failure of the drive. For the second type, a silent data corruption (SDC) error, data can be distorted in the process of transmitting, recording, storing or reading, but the fact of corruption as well as its position is not detected by technical (e.g., hardware) control devices.

In some aspects of the technology, an error correction coding approach is provided that includes detecting the presence and type of data corruption (e.g., data distortion), finding its position, and correcting the corrupted/erroneous data on the basis of certain redundant information.

Figure 1:
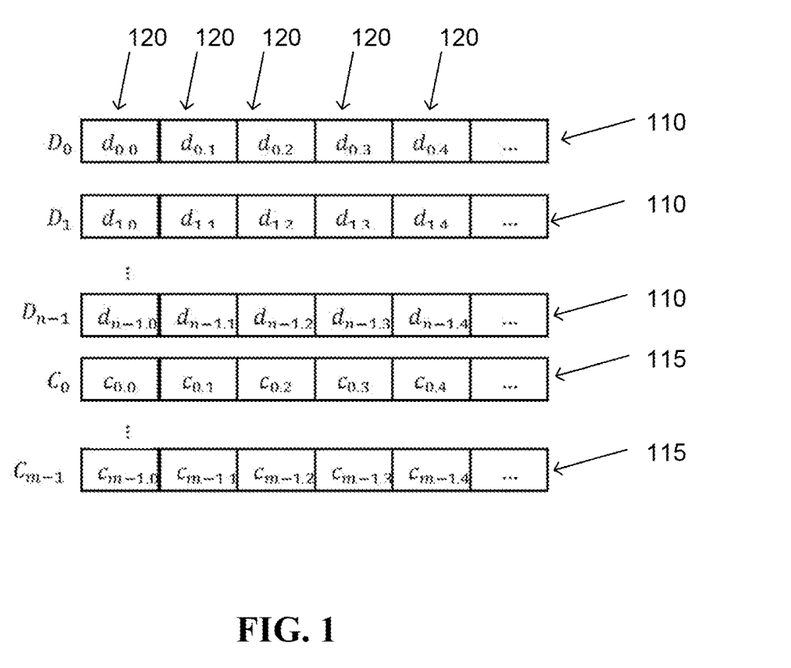
FIG. 1 shows exemplary data blocks and checksum blocks expressed as sequences of k-bit words.

In some embodiments, given a data storage device, the available memory of the data storage device can be partitioned into two subsets of equal-sized groups, blocks, or sequences of k-bit words. At least a portion of these blocks are called data blocks and are used to store useful information. These data blocks are denoted as $D_0, D_1, \ldots, D_{n-1}$. The remaining blocks store redundant information, which are used for data recovery in cases when an error or failure occurs. These blocks are called checksums and are denoted as $C_0, C_1, \ldots, C_{m-1}$. In this context, n and m stand for some positive integers, and it can be assumed that $m \leq n$. FIG. 1 shows exemplary data blocks 110 ($D_0$ to $D_{n-1}$) and checksum blocks 115 ($C_0$ to $C_{m-1}$) expressed as sequences of k-bit words 120 (e.g., $D_0$ is expressed as $d_{0,0}, d_{0,1} \ldots$).

Galois Fields and Reed-Solomon Codes

To ensure fault tolerance against both types of errors (i.e. failure errors and SDC errors), the formalism of finite (or Galois) fields can be used. The field $GF(2^k)$ of characteristic 2 can be taken. It contains $2^k$ elements which can be treated as k-bit words (vectors). Thus, with respect to k-bit words 120 in FIG. 1, one can treat $\{d_{i,j}, c_{i,j}\} \subset GF(2^k)$. Arithmetic of Galois fields includes operations on its elements such as addition, multiplication, inversion and discrete logarithm extraction. The sum of the elements $d_1$ and $d_2$ is defined as bitwise sum modulo 2 (XOR), while multiplication of the elements $d_1$ and $d_2$ is defined as polynomial product $d_1 * d_2$ modulo f with reduction coefficients modulo 2, where f is an irreducible polynomial that generates a Galois field. There exists a primitive element of the field, i.e., such an element $a \in GF(2^k)$ that its powers $a^0, a^1, \ldots, a^{2^k-2}$ represent distinct elements of the field. As a consequence, for any nonzero element d of the field there exists the unique solution of the equation $a^r = d$ with respect to $r \in \{0, 1, \ldots, 2^k-2\}$. This solution is called the (discrete) logarithm of d (to the base a).

In some embodiments, the above-defined finite field arithmetic is applied to the problem of recovering one type of errors—the failure errors. In the context of data storage technology, the n data blocks $D_0, D_1, \ldots, D_{n-1}$ (storing the useful information) are complemented with $m=2$ additional checksums $C_0, C_1$. The checksums are calculated by the following formulas:

$$C_0 = D_0 + D_1 + \ldots + D_{n-1},$$

$$C_1 = D_0 a^{n-1} + D_1 a^{n-2} + \ldots + D_{n-2} a + D_{n-1}. \quad (1)$$

The addition and multiplication operations in the right-hand sides of the formulas (1) are performed word-wide, i.e., $$D_0 + D_1 = (d_{0,0} + d_{1,0}, d_{0,1} + d_{1,1}, \ldots), \ldots,$$

$$D_0 a^{n-1} = (d_{0,0} a^{n-1}, d_{0,1} a^{n-1}, \ldots), \ldots.$$

with the word operations defined in an appropriate Galois field $GF(2^k)$, where a represents a primitive element of this field. If one or more of the data blocks $D_0, D_1, \ldots, D_{n-1}$ fail, then the values of the remaining data blocks and the recalculated values for $C_0, C_1$ by the formulas (1) permit one to restore the failed data blocks via resolving the system of two linear equations.

To extend the above failure recovery algorithm to the case of $m > 2$ errors, one can reserve m checksums $C_0, C_1, \ldots, C_{m-1}$. The values for these checksums are computed by the following formulas:

$$C_j = \sum_{i=0}^{n-1} D_i a^{j(n-i-1)}, \quad j = \overline{0, m-1}; \quad (2)$$

or, in the expanded form, the formulas for $C_0, C_1$ are equivalent to (1), while $C_2, \ldots, C_{m-1}$ are computed as:

$$C_2 = D_0 a^{2(n-1)} + D_1 a^{2(n-2)} + \ldots + D_{n-2} a^2 + D_{n-1},$$

$$C_3 = D_0 a^{3(n-1)} + D_1 a^{3(n-2)} + \ldots + D_{n-2} a^3 + D_{n-1},$$

. . . .

In some embodiments, a more complicated coding procedure known as the Reed-Solomon code is applied to the problem of recovering another type of errors, namely the SDC (Silent Data Corruption) errors. Given n data blocks $D_0, D_1, \ldots, D_{n-1}$, values for checksum blocks $C_0, C_1, \ldots, C_{m-1}$ are computed that satisfy the relations:

$$D_0 a^{j(n+m-1)} + D_0 a^{j(n+m-2)} + \ldots + D_{n-1} a^{jm} + C_0 a^{j(m-1)} +$$
$$C_1 a^{j(m-2)} + \ldots + C_{m-1} = \textcircled{0}, \quad j = \overline{0, m-1} \quad (3)$$

This procedure is known as systematic coding and can be formally performed via computation of the remainder of the polynomial in the variable $x$ $$(D_0 x^{n-1} + D_0 x^{n-2} + \ldots + D_{n-1}) x^m$$

on division by the polynomial $$g(\mathfrak{X}) = (\mathfrak{X} + a^0)(\mathfrak{X} + a^1) \ldots (\mathfrak{X} + a^{m-1}) \quad (4).$$

The coefficients of the remainder can be taken as the values of checksums.

To test some sequence of code blocks $D_0, D_1, \ldots, D_{n-1}, C_0, C_1, \ldots, C_{m-1}$ for the presence of SDC errors, one can substitute them into the left-hand side of the relations (3).

$$\tilde{S}_j = D_0 a^{j(n+m-1)} + D_0 a^{j(n+m-2)} + \ldots + D_{n-1} a^{jm} + \\ C_0 a^{j(m-1)} + C_1 a^{j(m-2)} + \ldots + C_{m-1}, \, j=\overline{0,m-1} \quad (5)$$

If all the computed values are equal to 0, then it is concluded that an SDC has not occurred. If, on the contrary, any of the values is nonzero, then at least one SDC has occurred in the given sequence. In this case, it is possible to detect the positions of one or more SDC errors and restore the correct values for the erroneous blocks provided that the number p of the occurred SDC errors satisfies the condition $p \le \lfloor m/2 \rfloor$, where $\lfloor m/2 \rfloor$ denotes the greatest integer not exceeding m/2. Hereinafter, the values $\tilde{S}_0, \tilde{S}_1, \ldots, \tilde{S}_{m-1}$ are referred to as syndromes of the sequence of blocks $D_0, D_1, \ldots, D_{n-1}, C_0, C_1, \ldots, C_{m-1}$.

Coding Using Vandermonde Matrix and Interpolation Polynomials

The technique described above can be formalized further with the aid of matrix analysis. A Vandermonde matrix, as follows, can be used:

$$V_{m,n}(\lambda_1, \ldots, \lambda_n) = \begin{pmatrix} 1 & 1 & \ldots & 1 \\ \lambda_1^1 & \lambda_2^1 & \ldots & \lambda_n^1 \\ \vdots & \vdots & \ldots & \vdots \\ \lambda_1^{m-1} & \lambda_2^{m-1} & \ldots & \lambda_n^{m-1} \end{pmatrix}$$

Here $\{\lambda_1, \ldots, \lambda_n\} \subset GF(2^k)$ are called the generating elements of the Vandermonde matrix. To rewrite equations (2) in matrix form, two extra matrices are introduced with the entries from $GF(2^k)$. These are matrix of data D and the checksum matrix C:

$$D = \begin{pmatrix} D_0 \\ D_1 \\ D_2 \\ \vdots \\ D_{n-1} \end{pmatrix}, C = \begin{pmatrix} C_0 \\ C_1 \\ C_2 \\ \vdots \\ C_{m-1} \end{pmatrix}$$

In these matrices, the blocks $D_0, D_1, \ldots, D_{n-1}, C_0, C_1, \ldots, C_{m-1}$ are treated as rows consisting of the elements from $GF(2^k)$.

In this notation, formulas (2) can be rewritten in matrix form as $$V_{m,n}(a^{n-1}, a^{n-2}, \ldots, 1)D = C \quad (6)$$

Equations (3) or (5) can also be represented with the aid of the Vandermonde matrix. For this purpose, the following matrix is introduced:

$$Y = \begin{pmatrix} D \\ C \end{pmatrix} = \begin{pmatrix} D_0 \\ D_1 \\ \vdots \\ D_{n-1} \\ C_0 \\ \vdots \\ C_{m-1} \end{pmatrix}$$

The rows of the matrix Y are denoted as $Y_0, \ldots, Y_{N-1}$, where N=n+m. Then equation (3) is equivalent to:

$$V_{m,N}(a^{N-1}, a^{N-2}, \ldots, 1)Y = \mathbb{O}$$

or to:

$$V_{m,n}(a^{N-1}, a^{N-2}, \ldots, a^m)D + V_{m,m}(a^{m-1}, \\ a^{m-2}, \ldots, 1)C = \mathbb{O} \quad (7)$$

with $\mathbb{O}$ denoting the column vector consisting of the zero elements of $GF(2^k)$. Therefore, the systematic coding described above can be computed as $$C = [V_{m,m}(a^{m-1}, a^{m-2}, \ldots, 1)]^{-1} V_{m,n}(a^{N-1}, \\ a^{N-2}, \ldots, a^m)D \quad (8)$$

Here $[V_{m,m}]^{-1}$ denotes the inversion of the Vandermonde matrix.

In one aspect, the inversion of the Vandermonde matrix can be used as an integral part of the systematic coding procedure of the present technology. A principal feature of the Vandermonde matrix in the context of error correction coding is based on the simple conditions for its nondegeneracy (in case of a square matrix, i.e. m=n). Specifically, the matrix $V_{n,n}(\lambda_1, \ldots, \lambda_n)$ is nondegenerate (invertible) if and only if all of its generating elements $\lambda_1, \ldots, \lambda_n$ are distinct.

To determine $[V_{n,n}(\lambda_1, \ldots, \lambda_n)]^{-1}$, the following basic interpolation polynomials $\tilde{W}_j(\mathfrak{X})$ $(j=\overline{1,n})$ are first introduced:

$$W(\mathfrak{X}) = \prod_{i=1}^{n} (\mathfrak{X} - \lambda_i),$$

$$W_j(\mathfrak{X}) = \frac{W(\mathfrak{X})}{\mathfrak{X} - \lambda_j} = \prod_{i=1, i \ne j}^{n} (\mathfrak{X} - \lambda_i),$$

$$\tilde{W}_j(\mathfrak{X}) = \frac{W_j(\mathfrak{X})}{W_j(\lambda_j)}$$

$$= \frac{W_j(\mathfrak{X})}{W'(\lambda_j)}$$

$$= \frac{(\mathfrak{X} - \lambda_1)(\mathfrak{X} - \lambda_2) \ldots (\mathfrak{X} - \lambda_{j-1})(\mathfrak{X} - \lambda_{j+1}) \ldots (\mathfrak{X} - \lambda_n)}{(\lambda_j - \lambda_1)(\lambda_j - \lambda_2) \ldots (\lambda_j - \lambda_{j-1})(\lambda_j - \lambda_{j+1}) \ldots (\lambda_j - \lambda_n)}$$

$$= w_{j,0} + w_{j,1} + \ldots + w_{j,n-1} \mathfrak{X}^{n-1}, \, j = \overline{1, n}.$$

Then $$[V_{n,n}(\lambda_1, \ldots, \lambda_n)]^{-1} = \begin{pmatrix} w_{1,0} & w_{1,1} & \ldots & w_{1,n-1} \\ w_{2,0} & w_{2,1} & \ldots & w_{2,n-1} \\ \vdots & \vdots & \ldots & \vdots \\ w_{n,0} & w_{n,1} & \ldots & w_{n,n-1} \end{pmatrix}$$

Using this result and the matrix multiplication rule, coding formula (8) can be rewritten in the form $$\begin{pmatrix} C_0 \\ C_1 \\ C_2 \\ \vdots \\ C_{m-1} \end{pmatrix} = \begin{pmatrix} \tilde{W}_1(a^{N-1}) & \tilde{W}_1(a^{N-2}) & \ldots & \tilde{W}_1(a^m) \\ \tilde{W}_2(a^{N-1}) & \tilde{W}_2(a^{N-2}) & \ldots & \tilde{W}_2(a^m) \\ \vdots & \vdots & \vdots & \vdots \\ \tilde{W}_m(a^{N-1}) & \tilde{W}_m(a^{N-2}) & \ldots & \tilde{W}_m(a^m) \end{pmatrix} \begin{pmatrix} D_0 \\ D_1 \\ D_2 \\ \vdots \\ D_{n-1} \end{pmatrix} \quad (9)$$

The matrix $$\begin{pmatrix} \tilde{W}_1(a^{N-1}) & \tilde{W}_1(a^{N-2}) & \ldots & \tilde{W}_1(a^m) \\ \tilde{W}_2(a^{N-1}) & \tilde{W}_2(a^{N-2}) & \ldots & \tilde{W}_2(a^m) \\ \vdots & \vdots & \vdots & \vdots \\ \tilde{W}_m(a^{N-1}) & \tilde{W}_m(a^{N-2}) & \ldots & \tilde{W}_m(a^m) \end{pmatrix}$$

in the right-hand side of formula (9) is called the coding matrix. Its entries are the values of the basic interpolation polynomials generated by the elements $\lambda_1 = a^{m-1}$, $\lambda_2 = a^{m-2}$, ..., $\lambda_m = 1$.

Figure 2:
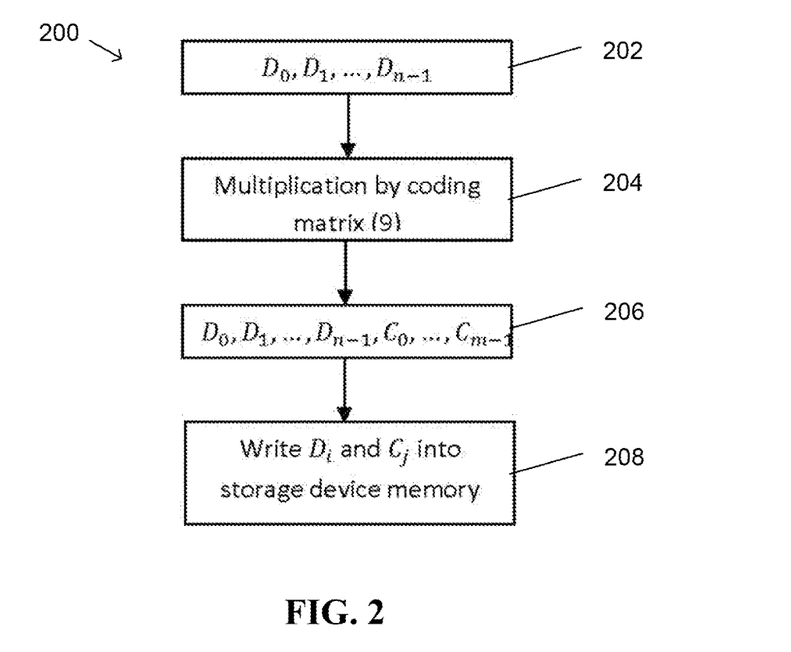
FIG. 2 depicts a flowchart illustrating an exemplary systematic coding process using formulas (9).

FIG. 2 depicts a flowchart 200 illustrating an exemplary systematic coding process using formulas (9). At step 202, data blocks $D_0$ to $D_{n-1}$ are provided, where these data blocks can have a format substantially similar to the configuration shown in FIG. 1. Encoding can be organized by multiplying the data blocks with coding matrix (9) at step 204 to generate, at step 206, checksum blocks $C_0$ to $C_{m-1}$, where the checksum blocks can have a format substantially similar to the configuration shown in FIG. 1. At step 208, the data blocks and checksum blocks are stored in device memory for later use. In some embodiments, if the number of the data blocks and the number of the checksum blocks are fixed (i.e., parameters n and m are fixed), then the coding matrix can be constructed once and used for coding of any sequence of code blocks of the same size.

Decoding

In some aspects, the matrix approach can be extended to the problem of error correction or decoding. It is assumed that the data blocks are already encoded systematically with the aid of formulas (9) using, for example, the algorithm described with reference to FIG. 2:

$$(D_0, D_1, \ldots, D_{n-1}) \to (Y_0, Y_1, \ldots, Y_{N-1})$$

The general theory of the error correction coding is that the redundancy in m checksum blocks permits one to correct the erroneous values of l failure errors (data lost at known positions) and p SDC errors (data lost at unknown positions) provided that the condition $l+2p \leq m$ is fulfilled. Below are exemplary data recovery algorithms in accordance with the present technology:

A. All the occurred errors are failure errors.
B. All the occurred errors are SDC errors.
C. A more general case of appearance of both types of errors A. Only Failure Errors Suppose that among the code blocks $Y_0, Y_1, \ldots, Y_{N-1}$ failure errors have occurred at the known positions $k_1, \ldots, k_l (k_1 < \ldots < k_l)$, $l \leq m$. Compose the matrix from the failed blocks:

$$\overline{Y} = \begin{pmatrix} Y_{k_1} \\ Y_{k_2} \\ Y_{k_3} \\ \vdots \\ Y_{k_l} \end{pmatrix} \text{ or, briefly, } \overline{Y} = [Y_i], i = \{k_1, \ldots, k_l\}$$

and from those remaining non-failed blocks:

$$Y' = \begin{pmatrix} \vdots \\ Y_{k_1-1} \\ Y_{k_1+1} \\ \vdots \\ Y_{k_2-1} \\ Y_{k_2+1} \\ \vdots \end{pmatrix} \text{ or, briefly, } Y' = [Y_i],$$

$$i = \{0, \ldots, N-1\} \backslash \{k_1, \ldots, k_l\}$$

(here \ stands for the relative complement). In some embodiments the error correcting algorithm works as follows:

Step 1: Construct the matrix with l rows and N–l columns $$R_{l,N-l} =$$

$$\begin{pmatrix} \tilde{W}_1(a^{N-1}) & \tilde{W}_1(a^{N-2}) & \ldots & \tilde{W}_1(a^{N-k_1}) & \tilde{W}_1(a^{N-k_1-2}) & \ldots & \tilde{W}_1(1) \\ \tilde{W}_2(a^{N-1}) & \tilde{W}_2(a^{N-2}) & \ldots & \tilde{W}_2(a^{N-k_1}) & \tilde{W}_2(a^{N-k_1-2}) & \ldots & \tilde{W}_2(1) \\ \vdots & \vdots & \vdots & \vdots & \vdots & \vdots & \vdots \\ \tilde{W}_l(a^{N-1}) & \tilde{W}_l(a^{N-2}) & \ldots & \tilde{W}_l(a^{N-k_1}) & \tilde{W}_l(a^{N-k_1-2}) & \ldots & \tilde{W}_l(1) \end{pmatrix}$$

or, briefly, $$R_{l,N-l} = [\tilde{W}_j(a^{N-1-i})], j = \{1, \ldots, l\},$$
$$i = \{0, \ldots, N-1\} \backslash \{k_1, \ldots, k_l\}, \quad (10)$$

which is called the recovery matrix. Here $\tilde{W}_1(x), \ldots, \tilde{W}_l(x)$ are the basic interpolation polynomials generated by the elements $\lambda_1 = a^{N-k_1-1}, \ldots, \lambda_l = a^{N-k_l-1}$.

Step 2: Recover failed blocks from those block without failure errors:

$$\overline{Y} = RY' \quad (11)$$

B. Only SDC Errors

Suppose that the sequence of code blocks $Y_0, \ldots, Y_{N-1}$ contains up to $p \leq \lfloor m/2 \rfloor$ SDC errors placed at a priori unknown positions $j_1, j_2, \ldots, j_p$. The exact value of p is to be determined within the error correcting process. Moreover, even the fact of occurrence of any of these SDC is not certain. To detect the SDC errors, the values for syndromes $\tilde{S}_j$ can be calculated using formulas (5):

$$\tilde{S}_j = \sum_{i=0}^{N-1} Y_i a^{j(N-i-1)}, j = \overline{0, m-1}$$

or, in matrix form:

$$\tilde{S} = V_{m,n}(a^{N-1}, a^{N-2}, \ldots, a, 1)Y \quad (12)$$

If at least one syndrome $\tilde{S}_j$ is not 0, then the sequence $Y_0, \ldots, Y_{N-1}$ contains at least one SDC error. To find the positions $j_1, j_2, \ldots, j_p$ of the SDC errors, an error locator polynomial can be constructed, i.e., the polynomial with the roots coinciding with the elements $$a^{N-j_1-1}, \ldots, a^{N-j_p-1}.$$

The coefficients of this polynomial (and value of p)

$$\sigma(x) = \sigma_0 x^p + \sigma_1 x^{p-1} + \sigma_2 x^{p-2} + \ldots + \sigma_p.$$

can be found with the aid of the iterative Berlekamp-Massey algorithm (BMA). It should be appreciated that any other algorithm to define the coefficients of the error locator polynomial, as many are well known to those of skill in the art, can be used.

In general, BMA can be briefly described as follow. The input of this algorithm is the sequence of m code words ($w_0, w_1, \ldots, w_{m-1}$) and the number t which is the maximal even number such that t≤m. To determine the coefficients of error locator polynomial $\sigma(x)$ in the BMA, two auxiliary polynomials $B(x)$ and $T(x)$ are used. The BMA consists of the following steps:
  1. Set initial parameters $$\sigma(x)=1, j=0, L=0, B(x)=1$$

2. Assign j=j+1
  3. Calculate value of correction $$\Delta_j = w_{j-1} + \sum_{i=1}^{L} \sigma_{L-i} w_{j-i-1}$$

4. $\Delta_j$ is compared to 0 if $\Delta_j=0$ then proceeds to step 9
  5. Calculate $T(x) = \sigma(x) - \Delta_j x B(x)$
  6. Verify whether to increase the degree of the current polynomial: value 2L is compared with j−1. If 2L>j−1 then proceeds to step 8
  7. Calculate new values of $B(x)$, $\sigma(x)$ and L.

$$B(x) = \Delta_j^{-1} \sigma(x), \sigma^{(j)}(x) = T(x), L = j-L$$

8. Assign $\sigma(x) = T(x)$
  9. Assign $B(x) = x B(x)$
  10. Check if j<t, then proceeds to step 2
  11. Check if deg $\sigma(x) \neq L$ then proceeds to step 13
  12. Completion of the algorithm
  13. Detected an unrecoverable error In the context of the present technology, the sequence $\tilde{S}_{m-1}, \tilde{S}_{m-2}, \ldots, \tilde{S}_1, \tilde{S}_0$ is an input of the algorithm. The outputs of the algorithm are the coefficients of the polynomial $\sigma(x)$, i.e. $\sigma_0, \sigma_1, \ldots, \sigma_p$. Roots of this polynomial are $a^{N-j_1-1}, \ldots, a^{N-j_p-1}$. One can find them with the aid of, for instance, the Chien's search algorithm for determining roots of polynomials defined over a finite field. It should be appreciated that any other algorithm for calculation of roots of the polynomial over the finite field, as many are well known to those of skill in the art, can be used. The exponents of the primitive element provide the SDC locations. When all the SDC locations are identified, the data in these blocks are restored using, for instance, the algorithm presented above in "A. Only Failure Errors" (e.g., by treating SDC error with known locations as failure errors).

C. Failure and SDC Errors

Consider now the general case, where, in addition to SDC errors, a sequence of data blocks also contains failure errors. Suppose within the data blocks there are l failure errors at the known positions $k_1, \ldots, k_l$ and up to p SDC errors at a priori unknown positions $j_1, j_2, \ldots, j_p$ (e.g., even the presence of the SDC errors is not certain). In this case, if the condition l+2p≤m is valid, then all the SDC errors can be detected and all the lost data due to both SDC and failure errors can be corrected in accordance with embodiments of the technology. In some embodiments, the following can be used to recover from failure errors and SDC errors:
  1. Detect presence of failure error (e.g., by technical control devices).
  2. Calculate syndrome matrix from blocks that do not contain failure errors $$\tilde{S} = V_{m,N-l}(a^{N-1}, a^{N-2}, \ldots, a^{N-k_1}, a^{N-k_1-2}, \ldots, a^{N-k_2}, a^{N-k_2-2}, \ldots) Y'$$

Here the generating elements of the Vandermonde matrix are the powers of the primitive element chosen from the set $$\{a^{N-1}, a^{N-2}, \ldots, a, 1\} \setminus \{a^{N-k_1-1}, a^{N-k_2-1}, \ldots, a^{N-k_l-1}\}$$

3. Construct the following auxiliary polynomial $$z(x) = \prod_{i=1}^{l} (x + a^{N-k_i-1}) = z_0 + z_1 x + \ldots + z_l x^l$$

4. Calculate values $$T_i = \sum_{j=0}^{l} z_j \tilde{S}_{i+j}, \quad i = \overline{0, m-l-1} \qquad (13)$$

5. If at least one of $T_i$ is not zero then an SDC error has occurred.
  6. An error locator polynomial is constructed and the positions of SDC errors are determined via the Berlekamp-Massey algorithm described in Section B, in which the input sequence is chosen as $T_{m-l-1}, T_{m-l-2}, \ldots, T_0$
  7. Find positions of the SDC errors via the error locator polynomial root evaluation.
  8. All data are restored according to the algorithm presented above in "A. Only Failure Errors," since now the positions of SDC-related and failure-related blocks are known.

Figure 3:
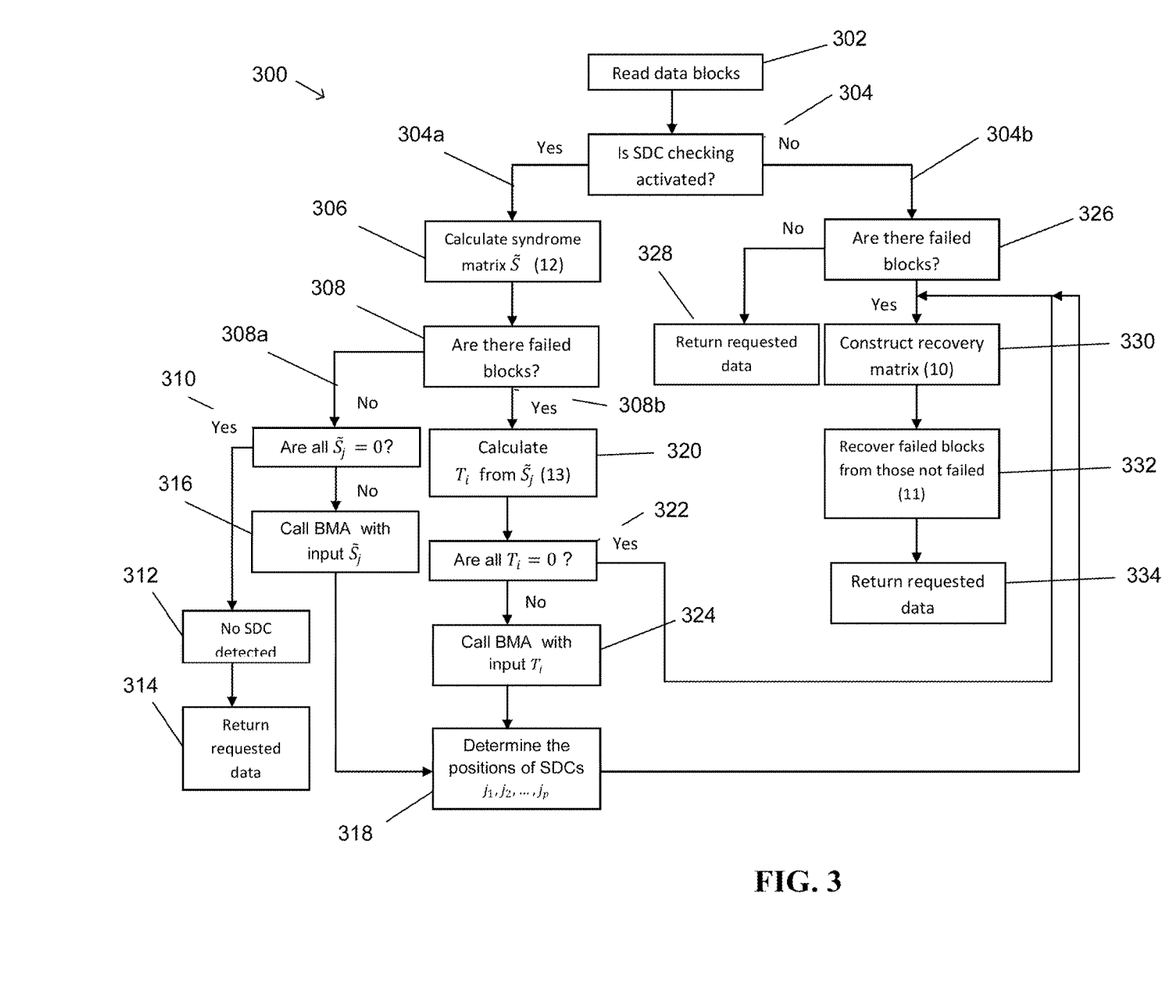
FIG. 3 depicts a flowchart illustrating an exemplary decoding process, according to some embodiments of the present technology.

FIG. 3 depicts a flowchart 300 illustrating an exemplary decoding process, according to some embodiments of the present technology. At step 302, the process starts by processing the data blocks that have already been encoded systematically according to the algorithm of FIG. 2. At step 304, if a decision is made to check for SDC errors in the data blocks, process execution proceeds with branch 304a. Otherwise, execution proceeds with branch 304b. To detect SDC errors in the data blocks, the values for syndromes $\tilde{S}_i$ are calculated at step 306 using matrix equation (12). At step 308, a determination is made regarding whether the data blocks also include failed blocks (i.e., blocks containing failure errors). If there are no failed blocks, it means that the data blocks include only SDC errors, if any, in which case process execution proceeds with branch 308a. If there is a failure block, it means that the data blocks can potentially include blocks with both failure and SDC errors, in which case process execution proceeds with branch 308b. In the case where the data blocks can potentially include only SDC errors, the process checks if all the syndromes are zero at step 310. If all the syndromes are zero, it means that there is no SDC error in the data blocks (step 312), in addition to not having any failed blocks. Hence, the process can return the requested data at step 314, along with an indication that there is no error associated with the data.

However, at step 310, if there is at least one nonzero syndrome, it means that the data blocks contain at least one SDC error. In this case, the process uses the iterative Berlekamp-Massey algorithm (BMA) at step 316 to determine the location(s) of the SDC error(s) in the data blocks at step 318. When all the SDC locations are identified, the errors in the data blocks are restored using the algorithm presented above in "A. Only Failure Errors," which begins at step 330.

At step 308, if there is at least one failed block, it means that the data blocks can potentially contain a mix of failure and SDC errors. In this case, $T_i$ are calculated at step 320 from the syndromes using formula (13). If all $T_i$ values are zero (step 322), it means that there is no SDC error and the data blocks contain only failure error(s). In this case, the failure errors in the data blocks are restored using the algorithm presented above in "A. Only Failure Errors," which begins at step 330. On the other hand, if at least one of the $T_i$ values is non-zero, then an SDC error has occurred in addition to at least one failure error. In this case, the process executes the BMA at step 324, in which the input sequence is $T_i$, to determine the location(s) of SDC error(s) at step 318. Both the failure and SDC errors are restored according to the algorithm presented above in the section "A. Only Failure Errors" starting at step 330, since now the positions of the SDC-related and failure-related blocks are known.

If SDC error checking is not activated at step 304, the process can determine at step 326 if there is any failure errors associated with the data blocks. If there is no failure error, the process can return the requested data at step 328, along with an indication that there is no failure error associated with the data. If there is at least one failure error in the data blocks, a recovery matrix is constructed using formula (10) at step 330. The blocks containing the errors can be recovered from those blocks that do not contain any errors using formula (11) at step 332. Finally, the process returns the requested data at step 334 with the errors corrected.

Figure 4:
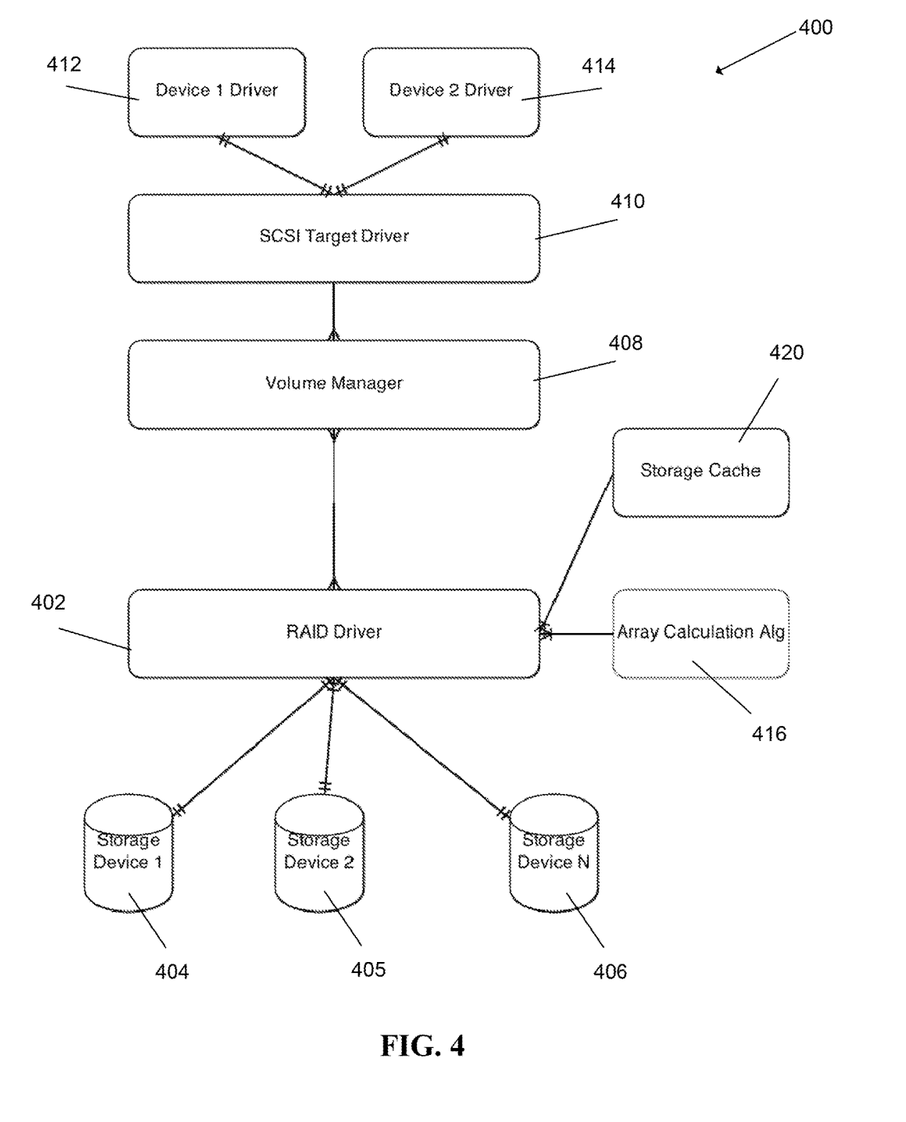
FIG. 4 illustrates an exemplary data storage system.

In some embodiments, the present technology can be implemented on a data storage system that includes one or more storage devices. As will be described in greater detail below, the data storage system can include a code block generation module implementing the encoding algorithms described herein (e.g., as described with respect to FIG. 2). The data storage system can include an error recovery module implementing the decoding algorithms described herein (e.g., as described above in the section entitled "Decoding" and/or with respect to FIG. 3). In some embodiments, the code block generation module and the error recovery module can be implemented in same hardware and/or software. FIG. 4 illustrates an exemplary data storage system 400. The data storage system 400 includes one or more hardware modules configured to implement the algorithms and/or software of the present technology. For example, the data storage system 400 can include one or more hardware devices to implement the algorithms described herein (e.g., as described above in the section entitled "Decoding" and/or with respect to FIGS. 2 and 3). As shown, the data storage system 400 includes at least one driver 402 that creates a redundant array of inexpensive disks (RAID) by combining multiple storage devices (e.g., Storage devices 404, 405, 406) into a logical unit for the purpose of data storage and redundancy. The RAID driver 402 can use these storage devices 404, 405, 406 to create a virtually-protected RAID system. In addition, a volume manager 408 is used to create virtual volumes using RAID's address space. The virtual volumes are presented to clients (e.g., device driver 412, 414) using a SCSI target driver 410. In some embodiments, the storage devices 404, 405, 406 codes data stored therein using the encoding algorithms described herein (e.g., as described with respect to FIG. 2). In some embodiments, the RAID driver 402 uses an array calculation algorithm module 416 that implements the decoding algorithms described herein (e.g., as described above in the section entitled "Decoding" and/or with respect to FIG. 3) to calculate checksums and perform corrective/restorative functions if failure errors and/or SDC errors are detected in the encoded data. In some embodiments, a storage cache 420 that is in electrical communication with the RAID driver 402 is used to store information pertinent to the decoding process, such as the decoded data, the locations of the errors in the data blocks, the corrected data, etc.

Figure 5:
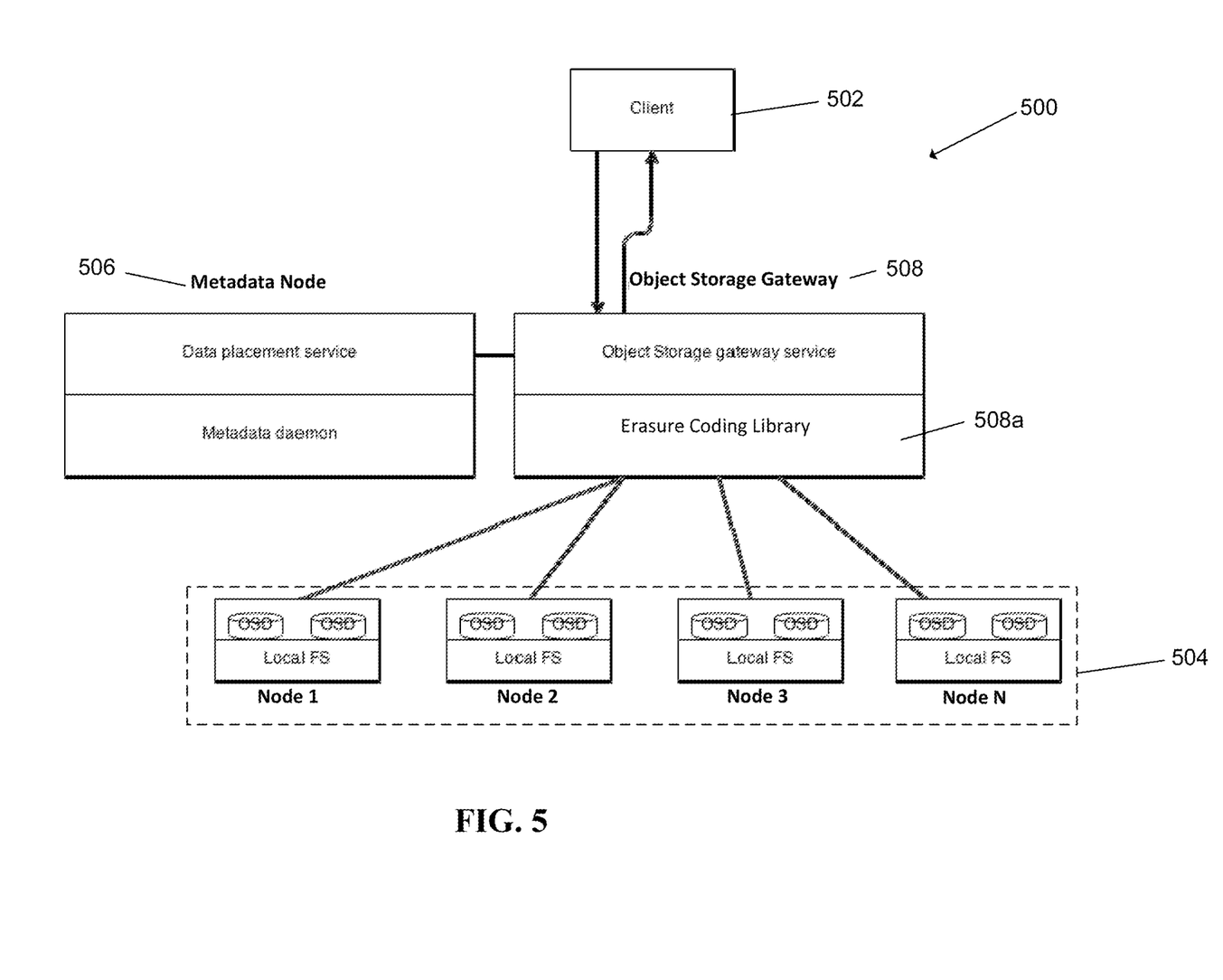
FIG. 5 illustrates an exemplary data storage system in a network environment.

FIG. 5 illustrates an exemplary data storage system 500 in a network environment. Specifically, the data storage system 500 includes one or more hardware modules configured to implement the algorithms and/or software of the present technology (e.g., as described above in the section entitled "Decoding" and/or with respect to FIGS. 2 and 3). As shown, the data storage system 500 includes at least one client 502, one or more storage nodes 504, a metadata node 506 and an object storage gateway 508. In operation, the client 502 writes data to one or more of the storage nodes 504 using, for example, a REST API metadata server (not shown), which contains information about the required protection level for the data. The storage gateway 508 is configured to split the received data into chunks and calculate additional data chunks to protect the received data using, for example, the encoding algorithm s described herein (e.g., as described with respect to FIG. 2). The erasure coding library 508a of the storage gateway 508 can calculate checksums (as a part of the additional data chunks) using the encoding algorithms. The number of data chunks and the number of additional protective data chunks generated by the storage gateway 508 are dependent on rules defined by a storage administrator. In addition, the storage gateway 508 can coordinate the storage of the data chunks and the additional data chunks in one or more of the nodes 504. In some embodiments, erasure coding library 508a can implement the decoding algorithms described herein (e.g., as described above in the section entitled "Decoding" and/or with respect to FIG. 3) for decoding and/or recovering data read from the nodes 504.

The above-described techniques can be implemented in digital and/or analog electronic circuitry, or in computer hardware, firmware, software, or in combinations of them. The implementation can be as a computer program product, i.e., a computer program tangibly embodied in a machine-readable storage device, for execution by, or to control the operation of, a data processing apparatus, e.g., a programmable processor, a computer, and/or multiple computers. A computer program can be written in any form of computer or programming language, including source code, compiled code, interpreted code and/or machine code, and the computer program can be deployed in any form, including as a stand-alone program or as a subroutine, element, or other unit suitable for use in a computing environment. A computer program can be deployed to be executed on one computer or on multiple computers at one or more sites.

Method steps can be performed by one or more processors executing a computer program to perform functions of the technology by operating on input data and/or generating output data. Method steps can also be performed by, and an apparatus can be implemented as, special purpose logic circuitry, e.g., a FPGA (field programmable gate array), a FPAA (field-programmable analog array), a CPLD (complex programmable logic device), a PSoC (Programmable System-on-Chip), ASIP (application-specific instruction-set processor), or an ASIC (application-specific integrated circuit), or the like. Subroutines can refer to portions of the stored computer program and/or the processor, and/or the special circuitry that implement one or more functions.

Processors suitable for the execution of a computer program include, by way of example, both general and special purpose microprocessors, and any one or more processors of any kind of digital or analog computer. Generally, a processor receives instructions and data from a read-only memory or a random access memory or both. The essential elements of a computer are a processor for executing instructions and one or more memory devices for storing instructions and/or data. Memory devices, such as a cache, can be used to temporarily store data. Memory devices can also be used for long-term data storage. Generally, a computer also includes, or is operatively coupled to receive data from or transfer data to, or both, one or more mass storage devices for storing data, e.g., magnetic, magneto-optical disks, or optical disks. A computer can also be operatively coupled to a communications network in order to receive instructions and/or data from the network and/or to transfer instructions and/or data to the network. Computer-readable storage mediums suitable for embodying computer program instructions and data include all forms of volatile and non-volatile memory, including by way of example semiconductor memory devices, e.g., DRAM, SRAM, EPROM, EEPROM, and flash memory devices; magnetic disks, e.g., internal hard disks or removable disks; magneto-optical disks; and optical disks, e.g., CD, DVD, HD-DVD, and Blu-ray disks. The processor and the memory can be supplemented by and/or incorporated in special purpose logic circuitry.

To provide for interaction with a user, the above described techniques can be implemented on a computer in communication with a display device, e.g., a CRT (cathode ray tube), plasma, or LCD (liquid crystal display) monitor, for displaying information to the user and a keyboard and a pointing device, e.g., a mouse, a trackball, a touchpad, or a motion sensor, by which the user can provide input to the computer (e.g., interact with a user interface element). Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, and/or tactile input.

The above described techniques can be implemented in a distributed computing system that includes a back-end component. The back-end component can, for example, be a data server, a middleware component, and/or an application server. The above described techniques can be implemented in a distributed computing system that includes a front-end component. The front-end component can, for example, be a client computer having a graphical user interface, a Web browser through which a user can interact with an example implementation, and/or other graphical user interfaces for a transmitting device. The above described techniques can be implemented in a distributed computing system (e.g., a cloud-computing system) that includes any combination of such back-end, middleware, or front-end components.

Communication networks can include one or more packet-based networks and/or one or more circuit-based networks in any configuration. Packet-based networks can include, for example, an Ethernet-based network (e.g., traditional Ethernet as defined by the IEEE or Carrier Ethernet as defined by the Metro Ethernet Forum (MEF)), an ATM-based network, a carrier Internet Protocol (IP) network (LAN, WAN, or the like), a private IP network, an IP private branch exchange (IPBX), a wireless network (e.g., a Radio Access Network (RAN)), and/or other packet-based networks. Circuit-based networks can include, for example, the Public Switched Telephone Network (PSTN), a legacy private branch exchange (PBX), a wireless network (e.g., a RAN), and/or other circuit-based networks. Carrier Ethernet can be used to provide point-to-point connectivity (e.g., new circuits and TDM replacement), point-to-multipoint (e.g., IPTV and content delivery), and/or multipoint-to-multipoint (e.g., Enterprise VPNs and Metro LANs). Carrier Ethernet advantageously provides for a lower cost per megabit and more granular bandwidth options.

Devices of the computing system can include, for example, a computer, a computer with a browser device, a telephone, an IP phone, a mobile device (e.g., cellular phone, personal digital assistant (PDA) device, laptop computer, electronic mail device), and/or other communication devices. The browser device includes, for example, a computer (e.g., desktop computer, laptop computer, mobile device) with a world wide web browser (e.g., Microsoft® Internet Explorer® available from Microsoft Corporation, Mozilla® Firefox available from Mozilla Corporation).

One skilled in the art will realize the technology may be embodied in other specific forms without departing from the spirit or essential characteristics thereof. The foregoing embodiments are therefore to be considered in all respects illustrative rather than limiting of the technology described herein. Scope of the technology is thus indicated by the appended claims, rather than by the foregoing description, and all changes that come within the meaning and range of equivalency of the claims are therefore intended to be embraced therein.

What is claimed:

1. A data storage system comprising:
one or more storage devices;
a code block generation module, wherein the code block generation module is configured, in response to receiving a first plurality of data blocks, to:
generate a first plurality of checksum blocks by multiplying the first plurality of data blocks by a coding matrix, wherein the coding matrix comprises values of at least one basic interpolation polynomial, the multiplying according to a finite field arithmetic for a finite field comprising all possible values of the first plurality of data blocks and the first plurality of coding block; and
store the first plurality of data blocks and the first plurality of checksum blocks in one or more storage devices of the one or more storage devices;
an error recovery module, wherein the error recovery module is configured to:
receive a plurality of code blocks, the plurality of code blocks comprising a second plurality of data blocks and a second plurality of checksum blocks, from the one or more storage devices;
detect a failure error at a failure location within the plurality of code blocks;
detect a silent data corruption (SDC) error at an SDC location within the plurality of code blocks by:
calculating a syndrome matrix from a first portion of the plurality of code blocks not containing the failure error; and
determining the SDC location of the SDC error in the plurality of code blocks based on the syndrome matrix;

construct a recovery matrix using the failure location and the SDC location; and recover a first block containing the failure error and a second block containing the SDC error by multiplying the recovery matrix with a second portion of the plurality of code blocks not containing the failure error and the SDC error, wherein the recovery matrix comprises values of at least one basic interpolation polynomial, the multiplying according to the finite field arithmetic for the finite field.

2. The data storage system of claim 1, wherein the coding matrix consists of a plurality of values of a plurality of basic interpolation polynomials computed for a sequence of powers of a primitive element of the finite field.

3. The data storage system of claim 1, wherein the code block generation module is further configured to:
construct the coding matrix of the form:

$$\begin{pmatrix} \tilde{W}_1(a^{N-1}) & \tilde{W}_1(a^{N-2}) & \ldots & \tilde{W}_1(a^m) \\ \tilde{W}_2(a^{N-1}) & \tilde{W}_2(a^{N-2}) & \ldots & \tilde{W}_2(a^m) \\ \vdots & \vdots & \vdots & \vdots \\ \tilde{W}_m(a^{N-1}) & \tilde{W}_m(a^{N-2}) & \ldots & \tilde{W}_m(a^m) \end{pmatrix}$$

wherein the first plurality of data blocks consists of n data blocks and the first plurality of checksum blocks consists of m checksum blocks;
wherein N=m+n;
wherein a is a primitive element of the finite field; and
wherein $\tilde{W}_1(x), \ldots, \tilde{W}_m(x)$ are basic interpolation polynomials.

4. The data storage system of claim 1, wherein the code block generation module is further configured to:
generate the coding matrix in response to receiving the first plurality of data blocks;
receive a third plurality of data blocks;
generate a second coding matrix in response to receiving the third plurality of data blocks;
generate a third plurality of checksum blocks by multiplying the third plurality of data blocks by the second coding matrix; and
store the third plurality of data blocks and the third plurality of checksum blocks in a second one or more storage devices of the one or more storage devices.

5. The data storage system of claim 1, wherein the code block generation module is further configured to:
receive a third plurality of data blocks;
generate a third plurality of checksum blocks by multiplying the third plurality of data blocks by the coding matrix; and
store the third plurality of data blocks and the third plurality of checksum blocks in a second one or more storage devices of the one or more storage devices.

6. The data storage system of claim 1, wherein the error recovery module is configured to determine the SDC location of the SDC error in the plurality of code blocks based on the syndrome matrix by constructing an error locator polynomial based on the syndrome matrix.

7. The data storage system of claim 6, wherein the error locator polynomial comprises a plurality of coefficients, wherein the error recovery module is configured to determine the coefficients of the error locator polynomial using a Berlekamp-Massey algorithm.

8. The data storage system of claim 6, wherein the error recovery module is configured to determine the SDC location of the SDC error in the plurality of code blocks based on the syndrome matrix by determining the SDC location based on a root of the error locator polynomial.

9. The data storage system of claim 1, wherein the recovery matrix consists of a plurality of values of a plurality of interpolation polynomials.

10. The data storage system of claim 1, wherein the error recovery module is configured to construct the recovery matrix using the failure location and the SDC location by:
constructing the recovery matrix of the form:

$R_{i,N-1} = [\tilde{W}_j(a^{N-1-i})], j=\{1, \ldots, l\},$
$i=\{0, \ldots, N-1\} \setminus \{k_1, \ldots, k_l\}$ wherein the second plurality of data blocks consists of n data blocks and the second plurality of checksum blocks consists of m checksum blocks;
wherein N=m+n;
wherein a is a primitive element of the finite field;
wherein $\tilde{W}_1(x), \ldots, \tilde{W}_l(x)$ are basic interpolation polynomials;
wherein l is a number of failure errors and SDC errors; and
wherein $\{k_1, \ldots, k_l\}$ comprise the failure location and the SDC location.

* * * * *